(12) United States Patent
Chiang

(10) Patent No.: US 12,100,450 B2
(45) Date of Patent: Sep. 24, 2024

(54) AREA EFFICIENT CONTENT ADDRESSABLE MEMORY DEVICE

(71) Applicant: REALTEK SEMICONDUCTOR CORPORATION, Hsinchu (TW)

(72) Inventor: I-Hao Chiang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 153 days.

(21) Appl. No.: 17/865,764

(22) Filed: Jul. 15, 2022

(65) Prior Publication Data

US 2023/0134680 A1  May 4, 2023

(30) Foreign Application Priority Data

Oct. 29, 2021 (TW) .................................. 110140414

(51) Int. Cl.
*G11C 15/04* (2006.01)
(52) U.S. Cl.
CPC .................................. *G11C 15/04* (2013.01)
(58) Field of Classification Search
CPC ...................................................... G11C 15/04
See application file for complete search history.

(56) References Cited

U.S. PATENT DOCUMENTS

| 6,046,923 | A | 4/2000 | Evans |
| 10,032,516 | B2 | 7/2018 | Dudeck |
| 2004/0024960 | A1* | 2/2004 | King ..................... G11C 15/00 711/108 |
| 2015/0332767 | A1* | 11/2015 | Arsovski ................ G11C 15/04 365/49.17 |
| 2016/0163385 | A1* | 6/2016 | Dudeck ................. G06F 30/394 365/49.17 |
| 2017/0278569 | A1* | 9/2017 | Dudeck ................. G06F 30/392 |

OTHER PUBLICATIONS

OA letter of a counterpart TW application (appl. No. 110140414) mailed on Jun. 28, 2022. Summary of the TW OA letter: 1. Claims 1 and 10 are rejected as allegedly failing to form a single general inventive concept in view of cited reference (U.S. Pat. No. 10,032,516B2).2. Claims 8 is rejected as allegedly being indefinite. Correspondence between claims of TW counterpart application and claims of US application: 1. Claims 1-9 and 10 in TW counterpart application correspond to claims 1-9 and 11 in US application, respectively.

* cited by examiner

*Primary Examiner* — Ajay Ojha
(74) *Attorney, Agent, or Firm* — WPAT, P.C

(57) ABSTRACT

A content addressable memory (CAM) device includes first to third CAM circuits and first to second peripheral circuits. The first CAM circuit stores a first bit of a first word. The second CAM circuit is arranged adjacent to the first CAM circuit and stores a first bit of a second word. The third CAM circuit is arranged adjacent to the second CAM circuit and store a second bit of the second word. The first to the third CAM circuits are arranged in a memory row. The first peripheral circuit accesses the first bits in the first and the second words. The second peripheral circuit accesses the second bit of the second word.

13 Claims, 6 Drawing Sheets

AREA EFFICIENT CONTENT ADDRESSABLE MEMORY DEVICE

BACKGROUND OF THE INVENTION

1. Field of the Invention

The present disclosure relates to a memory device, especially to a content addressable memory device having column muxing and sharing physical components.

2. Description of Related Art

A content addressable memory may quickly compare stored data with data to be searched, and output a comparison result. In a general content addressable memory, memory circuits storing different bit data in the same word are arranged in the same row, and memory circuits storing the same bit data in different words are arranged in the same column. Each memory column is provided with a corresponding peripheral circuit to read the bit data. As a result, the number of the peripheral circuits will be numerous and is thus unable to improve the efficiency of memory area. In addition, some existing column multiplexing arrangements of a memory array are no longer suitable to be implemented with a current process due to current process layout limitations or component location changes. If those arrangements are implemented with current process, larger circuit area may be required.

SUMMARY OF THE INVENTION

In some aspects of the present disclosure, a content addressable memory device includes a first content addressable memory circuit, a second content addressable memory circuit, a third content addressable memory circuit, a first peripheral circuit, and a second peripheral circuit. The first content addressable memory circuit is configured to store a first bit of a first word. The second content addressable memory circuit is arranged adjacent to the first content addressable memory circuit and is configured to store a first bit of a second word. The third content addressable memory circuit is arranged adjacent to the second content addressable memory circuit and configured to store a second bit of a second word, in which the first content addressable memory circuit, the second content addressable memory circuit, and the third content addressable memory circuit are arranged in a memory row. The first peripheral circuit is configured to access the first bit of the first word and the first bit of the second word. The second peripheral circuit is configured to access the first bit of the first word and the first bit of the second word.

In some aspects of the present disclosure, a content addressable memory device includes a first memory column including a first content addressable memory circuit, a second memory column arranged adjacent to the first memory column, and a match line. The second memory column includes a second content addressable memory circuit, and the first content addressable memory circuit and the second content addressable memory circuit are arranged in the same memory row. The first content addressable memory circuit and the second content addressable memory circuit are configured to store different bits of a word, and are connected to the match line through the same via.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
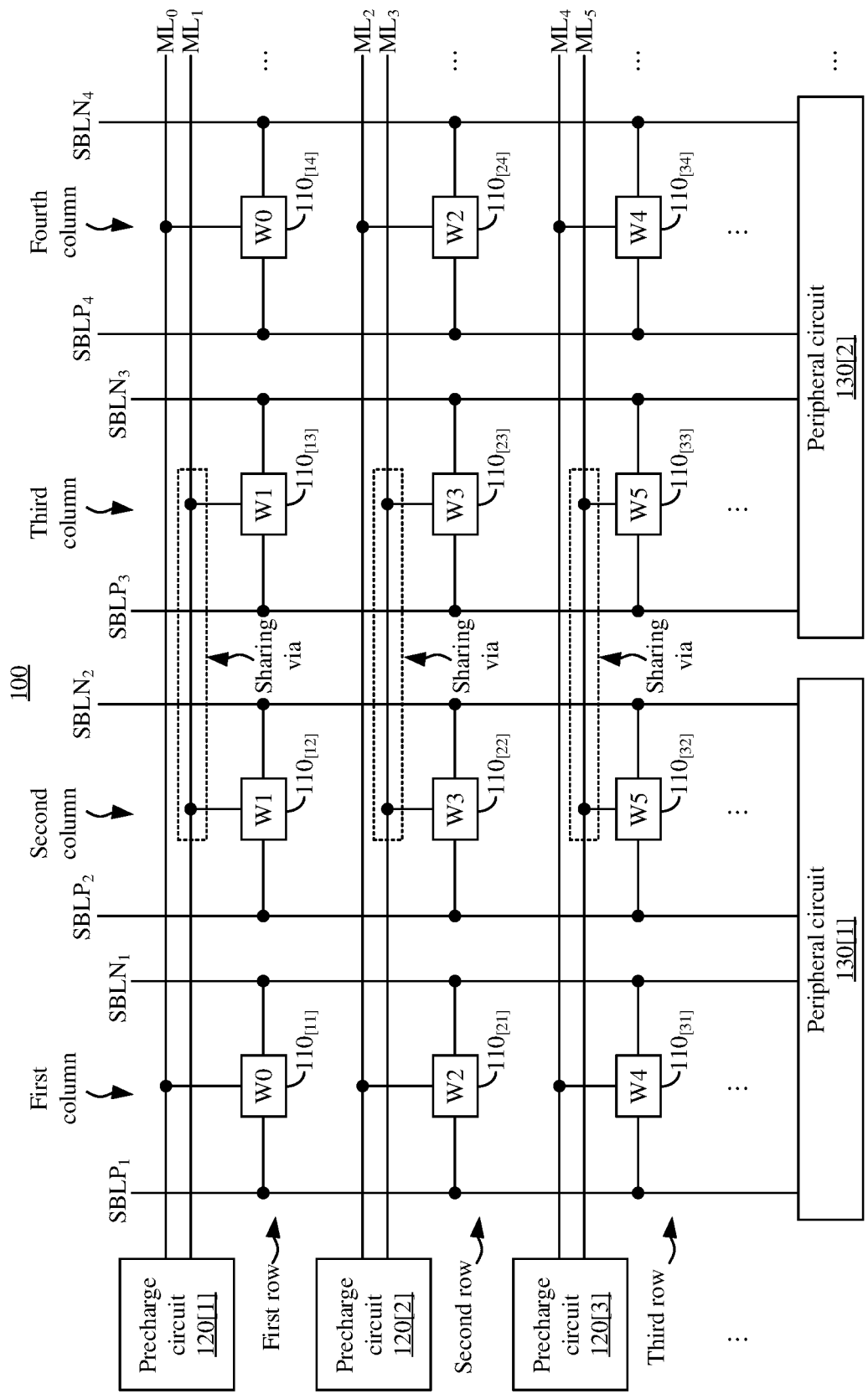
FIG. 1 illustrates a schematic diagram of a content addressable memory device according to some embodiments of the present disclosure.

FIG. 1 illustrates a schematic diagram of a content addressable memory (CAM) device (hereinafter referred to as "CAM device" for simplicity) 100 according to some embodiments of the present disclosure. The CAM device 100 includes content addressable memory circuits (hereinafter referred to as "CAM circuits" for simplicity) $110_{[11]}$-$110_{[14]}$, $110_{[21]}$-$110_{[24]}$, and $110_{[31]}$-$110_{[34]}$, precharge circuits 120[1]-120[3], peripheral circuit 130[1]-130[2], match lines $ML_0$-$ML_5$, and search bit lines $SBLP_1$-$SBLP_4$, and $SBLN_1$-$SBLN_4$.

The CAM circuit $110_{[11]}$-$110_{[14]}$, $110_{[21]}$-$110_{[24]}$, and $110_{[31]}$-$110_{[34]}$ are arranged as a memory array having memory columns (i.e., the consecutive first to fourth columns) and memory rows (i.e., the consecutive first to third rows). For example, the CAM circuits $110_{[11]}$-$110_{[14]}$ are arranged in a first row, the CAM circuits $110_{[21]}$-$110_{[24]}$ are arranged in a second row, and the CAM circuits $110_{[31]}$-$110_{[34]}$ are arranged in a third row. The CAM circuits $110_{[11]}$, $110_{[21]}$, and $110_{[31]}$ are arranged in a first column, the CAM circuits $110_{[12]}$, $110_{[22]}$, and $110_{[32]}$ are arranged in a second column, the CAM circuits $110_{[13]}$, $110_{[23]}$, and $110_{[33]}$ are arranged in a third column, and the CAM circuits $110_{[14]}$, $110_{[24]}$, and $110_{[34]}$ are arranged in a fourth column.

In the first row, the CAM circuit $110_{[11]}$ and the CAM circuit $110_{[14]}$ are coupled to the match line $ML_0$, the CAM circuit $110_{[11]}$ stores a first bit of a word W0, and the CAM circuit $110_{[14]}$ stores a second bit of the word W0. Similarly, the CAM circuit $110_{[12]}$ and the CAM circuit $110_{[13]}$ are coupled to the match line $ML_1$, the CAM circuit $110_{[12]}$ stores a first bit of a word W1, and the CAM circuit $110_{[13]}$ stores a second bit of the word W1. In second row, the CAM circuit $110_{[21]}$ and the CAM circuit $110_{[24]}$ are coupled to the match line $ML_2$, the CAM circuit $110_{[21]}$ stores a first bit of a word W2, and the CAM circuit $110_{[24]}$ stores a second bit of the word W2. Similarly, the CAM circuit $110_{[22]}$ and the CAM circuit $110_{[23]}$ are coupled to the match line $ML_3$, the CAM circuit $110_{[22]}$ stores a first bit of a word W3, and the CAM circuit $110_{[23]}$ stores a second bit of the word W3. In the third column, the CAM circuit $110_{[31]}$ and the CAM circuit $110_{[34]}$ are coupled to the match line $ML_4$, the CAM circuit $110_{[31]}$ stores a first bit of a word W4, and the CAM circuit $110_{[34]}$ stores a second bit of the word W4. Similarly, the CAM circuit $110_{[32]}$ and the CAM circuit $110_{[33]}$ are coupled to the match line $ML_5$, the CAM circuit $110_{[32]}$ stores a first bit of a word W5, and the CAM circuit $110_{[33]}$ stores a second bit of the word W5.

In the first column, the CAM circuit $110_{[11]}$, the CAM circuit $110_{[21]}$, and the CAM circuit $110_{[31]}$ are coupled to the peripheral circuit 130[1] via the search bit line $SBLP_1$ and the search bit line $SBLN_1$. In the second column, the CAM circuit $110_{[12]}$, the CAM circuit $110_{[22]}$, and the CAM circuit $110_{[32]}$ are coupled to the peripheral circuit 130[1] via the search bit line $SBLP_2$, and the search bit line $SBLN_2$. As a result, the peripheral circuit 130[1] may access (which may include reading and/or writing) the first bit of each of the words W0-W5. In some embodiments, the peripheral circuit 130[1] may include, but not limited to, a multiplexer circuit (not shown) and a sensing circuit (not shown). The multiplexer circuit may be configured to implement a function of column muxing, in order to selectively access data (i.e., first bit in each word W0-W5) from the first column or the second column. The sensing circuit may receive the data from the multiplexer circuit, and amplify the data to a logic level able to be recognized by subsequent circuit(s). Alternatively, in some embodiments, the peripheral circuit 130[1] may transmit a first bit of data to be searched to the CAM circuits in the first column and the second column.

Similarly, in the third column, the CAM circuit $110_{[13]}$, the CAM circuit $110_{[23]}$, and the CAM circuit $110_{[33]}$ are coupled to the peripheral circuit 130[2] via the search bit line $SBLP_3$ and the search bit line $SBLN_3$. In the fourth column, the CAM circuit $110_{[14]}$, the CAM circuit $110_{[24]}$, and the CAM circuit $110_{[34]}$ are coupled to the peripheral circuit 130[2] via the search bit line $SBLP_4$, and the search bit line $SBLN_4$. As a result, the peripheral circuit 130[2] may access the second bit of each word W0-W5. The implementations of the peripheral circuit 130[2] can be understood with reference to those of the peripheral circuit 130[1], and thus the repetitious descriptions are not further given herein.

Taking the first row as an example, the CAM circuit $110_{[11]}$, the CAM circuit $110_{[12]}$, the CAM circuit $110_{[13]}$, and the CAM circuit $110_{[14]}$ are sequentially arranged in the first row. In greater detail, the CAM circuit $110_{[12]}$ are arranged between the CAM circuit $110_{[11]}$ and the CAM circuit $110_{[13]}$. The CAM circuit $110_{[13]}$ is arranged adjacent to the CAM circuit $110_{[12]}$, and the CAM circuit $110_{[14]}$ is arranged adjacent to the CAM circuit $110_{[13]}$. As a result, the CAM circuit $110_{[12]}$ and the CAM circuit $110_{[13]}$ (which respectively store the first and second bits of the same word W1) are located between the CAM circuit $110_{[11]}$ and the CAM circuit $110_{[14]}$ (which respectively store the first and second bits of the same word W2), and the CAM circuit $110_{[12]}$ and the CAM circuit $110_{[13]}$ are respectively arranged in the second column and the third column that are adjacent to each other. With such arrangements, the CAM circuit $110_{[12]}$ and the CAM circuit $110_{[13]}$ may be connected to the match line $ML_1$ through the same via. With this analogy, in the second row, the CAM circuit $110_{[22]}$ and the CAM circuit $110_{[23]}$ may be connected to the match line $ML_3$ through the same via. In the third column, the CAM circuit $110_{[32]}$ and the CAM circuit $110_{[33]}$ may be connected to the match line $ML_5$ through the same via. As a result, the operation of column muxing can be implemented while saving the circuit area. The arrangements regarding herein will be described with reference to FIG. 3.

Figure 2A:
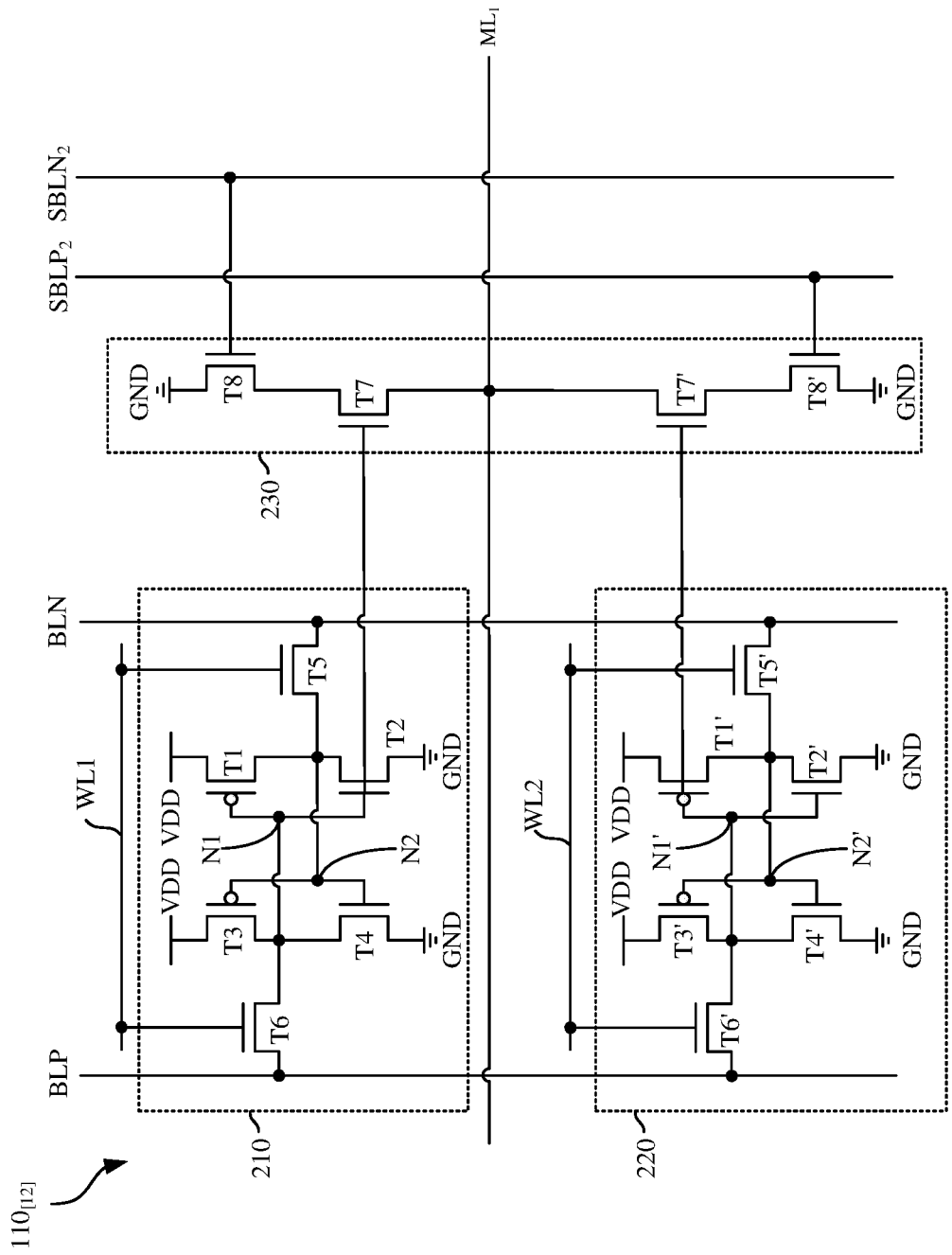
FIG. 2A illustrates a circuit diagram of a content addressable memory circuit in FIG. 1 according to some embodiments of the present disclosure.

FIG. 2A illustrates a circuit diagram of the CAM circuit $110_{[12]}$ in FIG. 1 according to some embodiments of the present disclosure. In this example, the CAM circuit $110_{[12]}$ includes a storage circuit 210, a storage circuit 220, and a comparison circuit 230. The storage circuit 210 stores the first bit of the word W1. The storage circuit 220 stores a mask bit, which may be configured to indicate an additional state (e.g., care state or don't care state). The comparison circuit 230 may receive the first bit of data to be searched, and determine whether to adjust the level of the match line $ML_1$ according to the first bit of the word W1, the mask bit, and the first bit of the data to be searched. The above operations can be understood with reference to functions of a general CAM circuit, and thus will not be described in further.

In this example, each of the storage circuit 210 and the storage circuit 220 may be a bit cell implemented with six transistors. In greater detail, the storage circuit 210 includes transistors T1-T6, and the comparison circuit 230 includes transistors T7-T8. A first terminal of the transistor T1 and a first terminal of the transistor T3 receive a voltage VDD. A second terminal of the transistor T1 is coupled to a first terminal of the transistor T2 and a first terminal of the transistor T5. A control terminal of the transistor T1, a control terminal of the transistor T2, a control terminal of the transistor T7, a second terminal of the transistor T3, a first terminal of the transistor T4, and a first terminal of the transistor T6 are coupled to a node N1. A control terminal of the transistor T3, a control terminal of the transistor T4, the second terminal of the transistor T1, the first terminal of the transistor T2, and the first terminal of the transistor T5 are coupled to a node N2. A control terminal of the transistor T5 and a control terminal of the transistor T6 are coupled to a word line WL1 corresponding to the CAM circuit $110_{[12]}$. A second terminal of the transistor T5 is coupled to a bit line BLN corresponding to the CAM circuit $110_{[12]}$, and a second terminal of the transistor T6 is coupled to a bit line BLP corresponding to the CAM circuit $110_{[12]}$. A first terminal of the transistor T7 is coupled to a second terminal of the transistor T8, and a second terminal of the transistor T7 is coupled to the match line $ML_1$. A first terminal of the transistor T8 receives a ground voltage GND, and the control terminal of the transistor T8 is coupled to the search bit line $SBLN_2$.

Similar to the storage circuit 210, the storage circuit 220 includes transistors T1'-T6' and the comparison circuit 230 further includes transistors T7'-T8'. A node N1' and a node N2' in the storage circuit 220 respectively corresponds to the node N1 and the node N2 in the storage circuit 210, and the connections among the transistors T1'-T8' are substantially the same as those among the transistors T1-T8 in the storage circuit 210, and thus the repetitious descriptions are not further given. In the storage circuit 220, the control terminal of the transistor T5' and the control terminal of the transistor T6 are coupled to a word line WL2 corresponding to the CAM circuit $110_{[12]}$. Moreover, compared with the transistor T8, the control terminal of the transistor T8' is coupled to the search bit line $SBLP_2$.

Figure 2B:
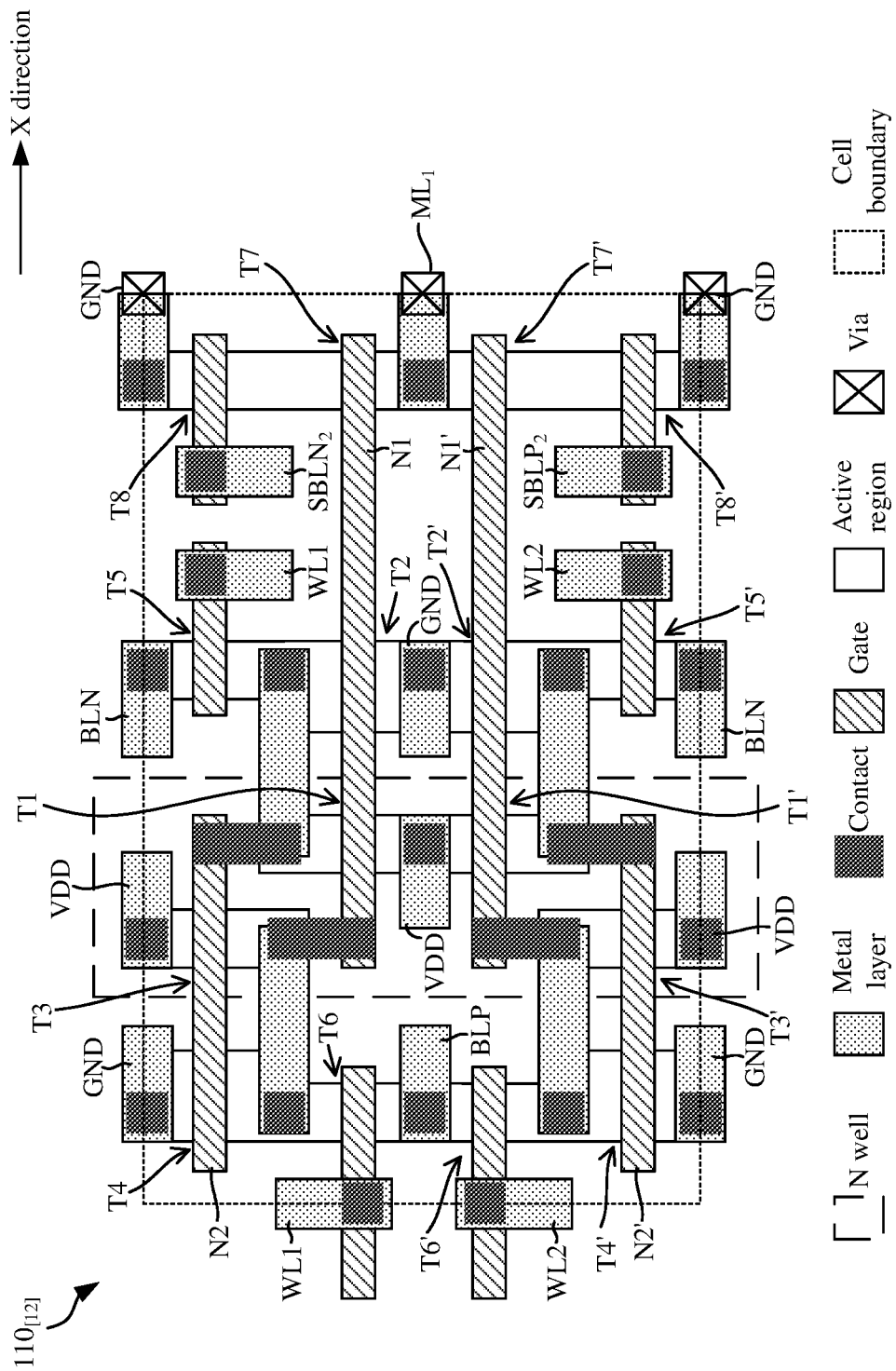
FIG. 2B illustrates a top view of the content addressable memory circuit in FIG. 2A according to some embodiments of the present disclosure.

FIG. 2B illustrates a top view of the CAM circuit $110_{[12]}$ in FIG. 2A according to some embodiments of the present disclosure. In some embodiments, FIG. 2B may be considered as a top view of the CAM circuit $110_{[12]}$ in a practical structure, or may be considered as a layout design diagram of the CAM circuit $110_{[12]}$.

Reference is made to both of FIG. 2A and FIG. 2B, the control terminal of each of the transistors T1-T8 and T1'-T8' may be a gate (shown with diagonal stripes). In this example, the gates are all arranged along a horizontal direction (e.g., X direction). For ease of understanding, the corresponding locations of the gates of the transistors T1-T8 and T1'-T8' are labeled. As the node N1 is coupled to the control terminals of the transistors T1, T2, and T7, the control terminals of the transistors T1, T2, and T7 may be implemented with the same gate structure (e.g., polysilicon). As the node N1' is coupled to the control terminals of the transistors T1', T2', and T7', the control terminals of the transistors T1', T2', and T7' may be implemented with the same gate structure. With this analogy, the control terminals of the transistors T3 and T4 may be implemented with the same gate structure, and the control terminals of the transistors T3' and T4' may be implemented with the same gate structure.

The first terminal and the second terminal of each of the transistors T1-T8 and T1'-T8' may be a drain (or a source) and a source (or a drain), which may be two terminals on an active region (shown in white) and located at the left and right sides of the gate. The transistors T1, T3, T1', and T3' are P-type transistors, and thus are arranged in N well(s). A contact may couple terminals or gates on the active region to a corresponding metal layer (shown with dots), in order to be connected with specific component(s) (e.g., the bit line BLN, the bit line BLP, the search bit line $SBLN_2$, the search bit line $SBLP_2$, the word line WL1, or the word line WL2) or to receive specific voltage(s) (e.g., the voltage VDD or the ground voltage GND). A via may couple the metal layer to specific component(s) (e.g., the match line $ML_1$) or to receive the specific voltage (e.g., the voltage VDD or the ground voltage GND). By referring FIG. 2A and FIG. 2B, the specific arrangements among the components in the CAM circuit $110_{[12]}$ can be understood.

Figure 2C:
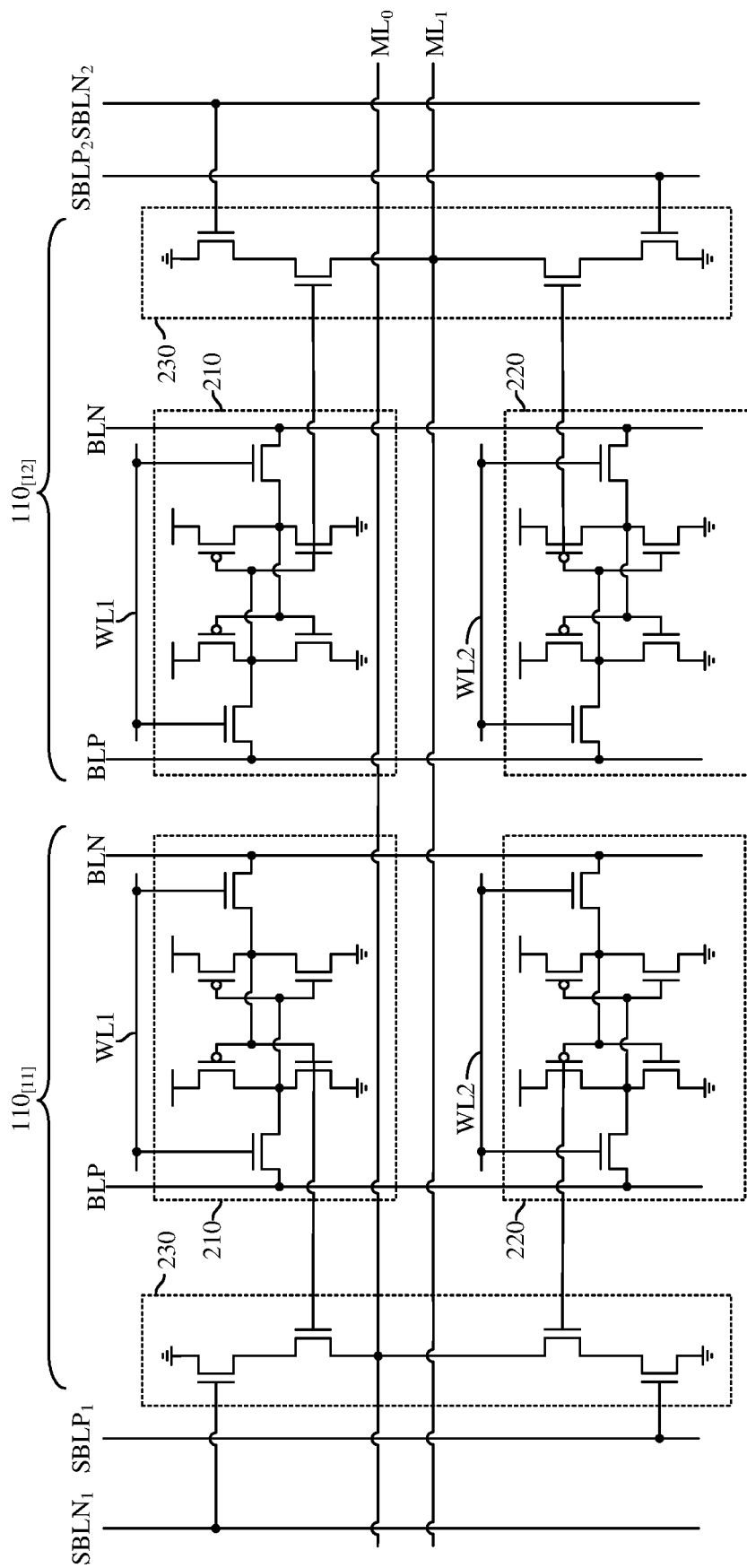
FIG. 2C illustrates a schematic diagram of two content addressable memory circuits in FIG. 1 according to some embodiments of the present disclosure.

FIG. 2C illustrates a schematic diagram of the CAM circuit $110_{[11]}$ and the CAM circuit $110_{[12]}$ in FIG. 1 according to some embodiments of the present disclosure.

The structure of the CAM circuit $110_{[12]}$ is the same as that in FIG. 2A and thus the repetitious descriptions are not further given. As shown in FIG. 2C, the structure of the CAM circuit $110_{[11]}$ is substantially the same as that of the CAM circuit $110_{[12]}$. Compared with the CAM circuit $110_{[12]}$, the comparison circuit 230 in the CAM circuit 110[1] is coupled to the match line $ML_0$, the search bit line $SBLP_1$, and the search bit line $SBLN_1$.

Figure 2D:
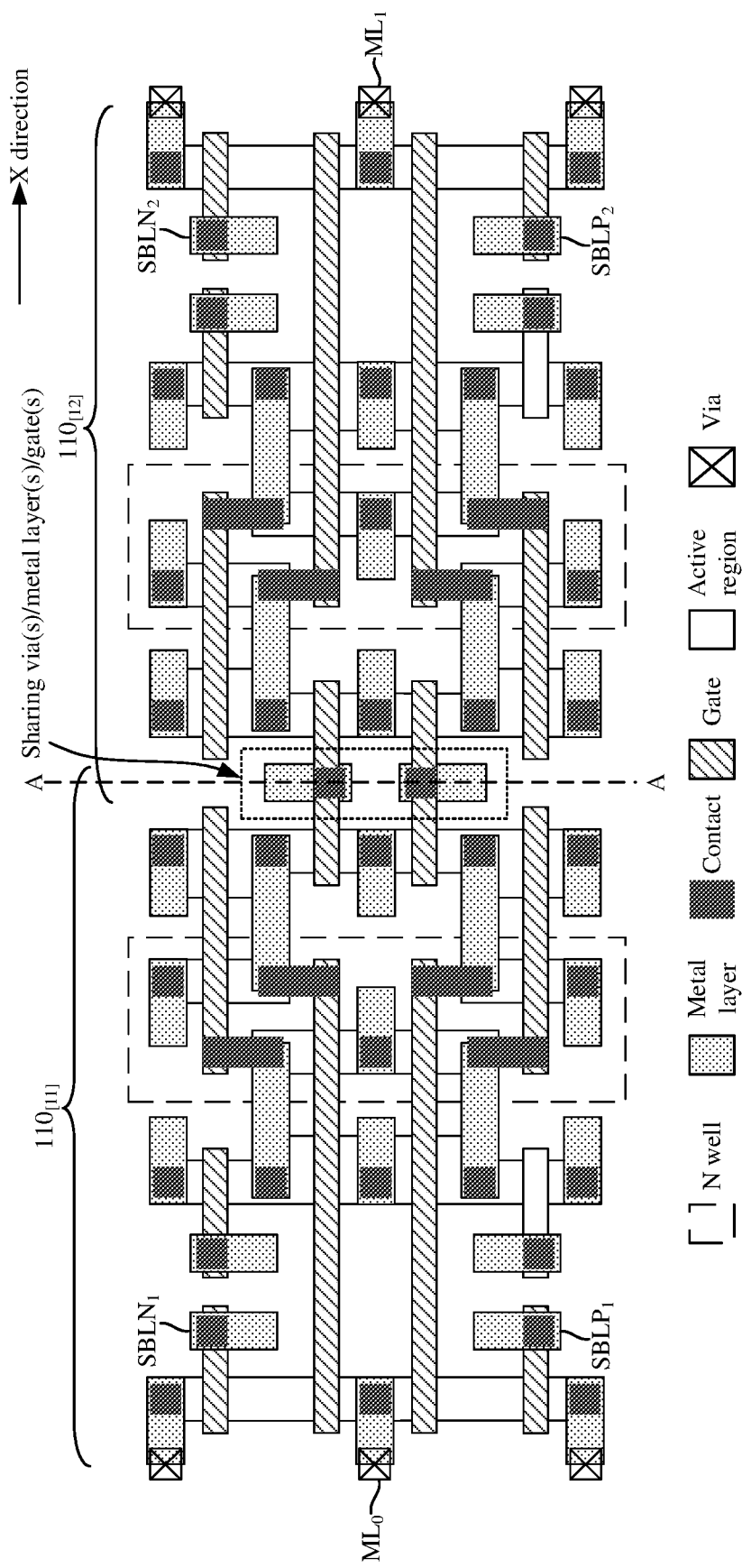
FIG. 2D illustrates a top view of the two content addressable memory circuits in FIG. 2C according to some embodiments of the present disclosure.

FIG. 2D illustrates a top view of the CAM circuit $110_{[11]}$ and the CAM circuit $110_{[12]}$ in FIG. 2C according to some embodiments of the present disclosure. In some embodiments, FIG. 2D may be considered as a top view of the CAM circuit $110_{[11]}$ and the CAM circuit $110_{[12]}$ in a practical structure, or may be considered as a layout design diagram of the CAM circuit $110_{[11]}$ and the CAM circuit $110_{[12]}$. The arrangements of each components in FIG. 2D can be understood with reference to FIG. 2B, and thus the repetitious descriptions are not further given.

As mentioned above, the CAM circuit $110_{[11]}$ and the CAM circuit $110_{[12]}$ have the same structure. As shown in FIG. 2D, the structure of the CAM circuit $110_{[11]}$ and that of the CAM circuit $110_{[12]}$ are substantially mirror symmetric with respect to a reference line A-A. In this example, the CAM circuit $110_{[11]}$ and the CAM circuit $110_{[12]}$ may share partial contact(s), metal layer(s), and/or gate(s) to be coupled with the word line WL1 and the word line WL2. As a result, the circuit area can be further saved. Moreover, the search bit line $SBLN_1$ and the search bit line $SBLP_1$ are arranged at the left side of FIG. 2D, the search bit line $SBLN_2$ and the search bit line $SBLP_2$ are arranged at the right side of FIG. 2D, and the search bit line $SBLN_1$ and the search bit line $SBLP_1$ are independent to the search bit line $SBLN_2$ and the search bit line $SBLP_2$. The CAM circuit $110_{[11]}$ and the CAM circuit $110_{[12]}$ receive the same data (e.g., the first bit of data to be searched) from the peripheral circuit 130[1]. By utilizing independent search bit lines to transmit the same data to the CAM circuit $110_{[11]}$ and the CAM circuit $110_{[12]}$, the loading on each search bit line can be lower (compared with using a single search bit line to transmit data to CAM circuits in two columns). As a result, the operating speed can be increased.

Figure 3:
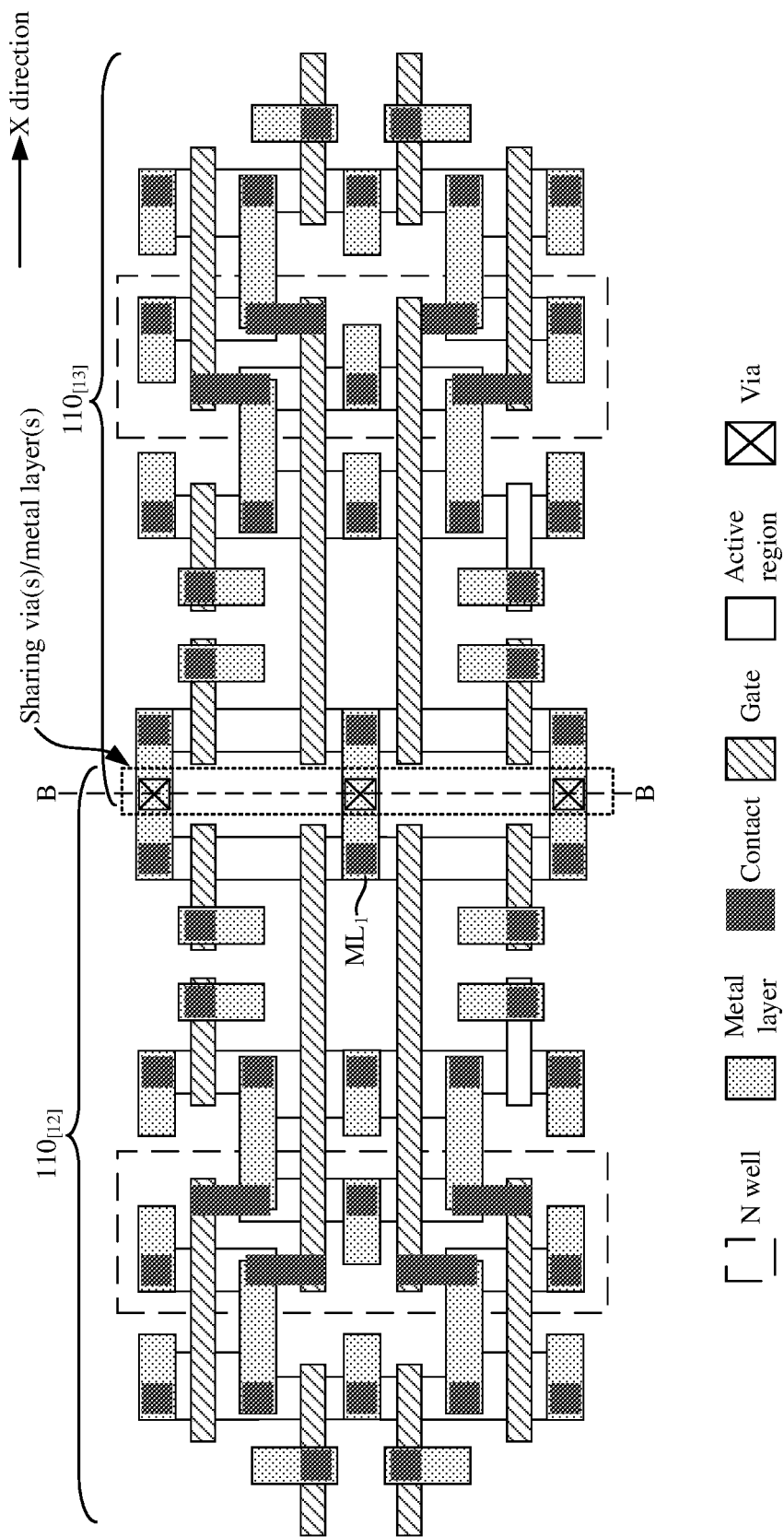
FIG. 3 illustrates a top view of two content addressable memory circuits in FIG. 1 according to some embodiments of the present disclosure.

FIG. 3 illustrates a top view of the CAM circuit $110_{[12]}$ and the CAM circuit $110_{[13]}$ in FIG. 1 according to some embodiments of the present disclosure. In some embodiments, FIG. 3 may be considered as a top view of the CAM circuit $110_{[12]}$ and the CAM circuit $110_{[13]}$ in a practical structure, or may be considered as a layout design diagram of the CAM circuit $110_{[12]}$ and the CAM circuit $110_{[13]}$. The arrangements of various components in FIG. 3 can be understood with reference to FIG. 2B, and thus the repetitious descriptions are not further given.

As mentioned above, the CAM circuit $110_{[12]}$ and the CAM circuit $110_{[13]}$ have the same structure. As shown in FIG. 3, the structure of the CAM circuit $110_{[12]}$ and that of the CAM circuit $110_{[13]}$ are substantially mirror symmetric with respect to a reference line B-B. As the CAM circuit $110_{[12]}$ and the CAM circuit $110_{[13]}$ are all coupled to the match line $ML_1$, the CAM circuit $110_{[12]}$ and the CAM circuit $110_{[13]}$ may share partial via(s) and/or metal layer(s) to be coupled with the match line $ML_1$. As a result, the circuit area can be further saved.

The number of components and/or connections therebetween in each figure are given for illustrative purposes, and the present disclosure is not limited thereto. For example, the CAM device 100 in FIG. 1 may include more columns and/or more rows. Alternatively, in a practical routing design, FIG. 2B, FIG. 2D, or FIG. 3 may include more metal layers, contacts, and/or vias for connections.

As described above, the CAM device provided in some embodiments of the present disclosure may change arrangements of the memory circuits in a memory array, in order to achieve the function of column muxing and the effect of sharing partial components. As a result, the number of circuit components can be reduced, the circuit area is thus saved, and the loading on wire(s) can be reduced to increase the operating speed.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A content addressable memory device, comprising:
   a first content addressable memory circuit configured to store a first bit of a first word;
   a second content addressable memory circuit arranged adjacent to the first content addressable memory circuit and configured to store a first bit of a second word;
   a third content addressable memory circuit arranged adjacent to the second content addressable memory circuit and configured to store a second bit of a second word,
   wherein the first content addressable memory circuit, the second content addressable memory circuit, and the third content addressable memory circuit are arranged in a memory row;
   a first peripheral circuit configured to access the first bit of the first word and the first bit of the second word; and
   a second peripheral circuit configured to access the first bit of the first word and the first bit of the second word.

2. The content addressable memory device of claim 1, wherein a structure of the second content addressable memory circuit and a structure of the third content addressable memory circuit are mirror symmetric.

3. The content addressable memory device of claim 1, further comprising:
   a first match line coupled to the first content addressable memory circuit; and
   a second match line coupled to the second content addressable memory circuit and the third content addressable memory circuit.

4. The content addressable memory device of claim 3, wherein the second content addressable memory circuit and the third content addressable memory circuit are coupled to the second match line through the same via.

5. The content addressable memory device of claim 1, wherein the second content addressable memory circuit and the third content addressable memory circuit are arranged in two memory columns that are adjacent to each other.

6. The content addressable memory device of claim 1, wherein the second content addressable memory circuit is arranged between the first content addressable memory circuit and the third content addressable memory circuit and the third content addressable memory circuit.

7. The content addressable memory device of claim 1, further comprising:
   a fourth content addressable memory circuit arranged in the memory row and arranged adjacent to the third content addressable memory circuit, and configured to store a second bit of the first word,
   wherein the second peripheral circuit is further configured to access the second bit of the first word.

8. The content addressable memory device of claim 7, wherein the second content addressable memory circuit and the third content addressable memory circuit are arranged between the first content addressable memory circuit and the fourth content addressable memory circuit.

9. The content addressable memory device of claim 7, wherein the first content addressable memory circuit, the second content addressable memory circuit, the third content addressable memory circuit, and the fourth content addressable memory circuit are sequentially arranged in different memory columns.

10. The content addressable memory device of claim 1, wherein a structure of the first content addressable memory circuit and a structure of the second content addressable memory circuit are mirror symmetric.

11. A content addressable memory device, comprising:
    a first memory column comprising a first content addressable memory circuit;
    a second memory column arranged adjacent to the first memory column, wherein the second memory column comprises a second content addressable memory circuit, and the first content addressable memory circuit and the second content addressable memory circuit are arranged in the same memory row; and
    a match line, wherein the first content addressable memory circuit and the second content addressable memory circuit are configured to store different bits of a word, and are connected to the match line through the same via,
    wherein a structure of the first content addressable memory circuit and a structure of the second content addressable memory circuit are mirror symmetric.

12. The content addressable memory device of claim 11, wherein data stored in the first memory column is accessed by a first peripheral circuit, data stored in the second memory column is accessed by a second peripheral circuit, and the first peripheral circuit is different from the second peripheral circuit.

13. The content addressable memory device of claim 11, wherein the first memory column and the second memory column are two consecutive columns in a memory array.

* * * * *